US005700338A

United States Patent [19]

Kubodera et al.

[11] Patent Number: 5,700,338

[45] Date of Patent: Dec. 23, 1997

[54] METHOD OF MANUFACTURING RESISTOR INTEGRATED IN SINTERED BODY AND METHOD OF MANUFACTURING MULTILAYER CERAMIC ELECTRONIC COMPONENT

[75] Inventors: Noriyuki Kubodera, Shiga-ken; Yoshiaki Kouno, Moriyama, both of Japan

[73] Assignee: Murata Manufacturing Co., Ltd., Nagaokakyo, Japan

[21] Appl. No.: 490,089

[22] Filed: Jun. 13, 1995

[30] Foreign Application Priority Data

Jun. 14, 1994 [JP] Japan .................................... 6-131900

[51] Int. Cl.$^6$ ........................... B32B 31/26; B32B 31/12; H05K 3/20

[52] U.S. Cl. ........................... 156/89; 156/233; 156/235; 156/239; 264/616; 264/619; 29/851

[58] Field of Search ..................................... 156/233, 235, 156/239, 89; 29/831, 847, 851; 264/61, 616, 619; 427/96

[56] References Cited

U.S. PATENT DOCUMENTS

| | | | |
|---|---|---|---|
| 2,711,983 | 6/1955 | Hoyt | 156/89 |
| 3,266,661 | 8/1966 | Dates | 156/89 X |
| 3,615,980 | 10/1971 | Schuck et al. | 156/89 |
| 3,655,496 | 4/1972 | Ettre et al. | 156/89 X |
| 4,697,335 | 10/1987 | Pedersen . | |
| 4,722,765 | 2/1988 | Ambros et al. | 156/233 X |
| 4,879,156 | 11/1989 | Herron et al. . | |
| 5,292,548 | 3/1994 | Rainwater | 427/97 |
| 5,480,503 | 1/1996 | Casey et al. | 156/89 |

FOREIGN PATENT DOCUMENTS

| | | |
|---|---|---|
| 0 381 879A1 | 8/1990 | European Pat. Off. . |
| 0 485 176A2 | 5/1992 | European Pat. Off. . |
| 0 581 294A2 | 2/1994 | European Pat. Off. . |
| 0 629 110A2 | 12/1994 | European Pat. Off. . |
| 1 258 660 | 12/1971 | United Kingdom . |
| 1 379 366 | 1/1975 | United Kingdom . |

*Primary Examiner*—Melvin Mayes
*Attorney, Agent, or Firm*—Burns, Doane, Swecker & Mathis, LLP

[57] ABSTRACT

A method of manufacturing a resistor integrated in a sintered body, by patterning a plurality of metal thin films which are formed by a thin film forming method, thereafter transferring the patterned metal thin films onto a ceramic green sheet (11), stacking another ceramic green sheet and/or a ceramic green sheet stacked with another metal thin film thereon for obtaining a laminate, and firing the resulting laminate, thereby forming a resistor integrated in a sintered body which is structured by by alloying the plurality of metal thin films in a ceramic sintered body.

16 Claims, 3 Drawing Sheets

METHOD OF MANUFACTURING RESISTOR INTEGRATED IN SINTERED BODY AND METHOD OF MANUFACTURING MULTILAYER CERAMIC ELECTRONIC COMPONENT

BACKGROUND OF THE INVENTION

1. Field of the Invention

The present invention relates to a method of manufacturing a resistor which is integrated in a multilayer ceramic electronic component such as a ceramic multilayer substrate, for example, and a method of manufacturing such a multilayer ceramic electronic component.

2. Description of the Background Art

A ceramic multilayer substrate is generally manufactured through the following steps: First, ceramic green sheets are formed and a conductor film or resistor film is formed on one surface thereof for forming an electronic component element such as a capacitor, inductor or resistance. In this case, the conductor film or the resistor film is formed by pattern-printing a conductive paste or resistive paste by screen printing or the like and then drying the same.

In order to electrically connect upper and lower conductor films with each other in the ceramic multilayer substrate, through holes are formed in the ceramic green sheets at need and filled up with conductive paste, to define via hole conductors.

A plurality of ceramic green sheets prepared in the aforementioned manner are stacked with each other to obtain a multilayered body, and the multilayered body pressurized along the thickness direction. Thereafter the multilayered body is fired, and the conductor films or the resistor films consisting of the conductive paste or the resistive paste are baked, for obtaining the ceramic multilayer substrate.

As the aforementioned resistive paste, there is used one containing ruthenium oxide or carbon. Namely, the resistive paste is prepared by adding a synthetic resin binder and a solvent to ruthenium oxide powder or carbon powder and kneading the same.

As hereinabove described, it is necessary to pattern-print the resistive paste, dry the same and carry Out a heat treatment, in order to form the resistor film. In order to form various resistive elements, therefore, it is necessary to prepare various printing patterns in response thereto. Due to the pattern printing of the resistive paste, further, it is extremely difficult to vary the composition of the paste dependent on a respective resistive element in formation of a plurality of resistive elements in a circuit.

Due to the pattern printing of the resistive paste, further, pattern accuracy is insufficient. In formation of fine lines, for example, printing accuracy of the resistive paste is merely about 20 μm. Thus, it is difficult to form resistive elements in high accuracy, and to implement desired resistance values in high accuracy.

In addition, resistive paste, which is prepared by using ruthenium oxide or carbon, requires atmospheric control in baking and firing. For example, paste containing ruthenium oxide must be fired in an oxidizing atmosphere, Therefore, only conductive paste which is mainly composed of a noble metal having excellent oxidation resistance can be employed for conductor films which are arranged in the substrate with resistors integrated in the substrate, and hence the cost for the ceramic multilayer substrate is disadvantageously increased.

On the other hand, there is also employed a method of preparing resistive paste from a material requiring no strict atmospheric control in baking and firing thereof, such as paste containing a metal. When such metal paste requiring no strict atmospheric control is employed, however, sectional areas thereof must be considerably reduced in order to implement sufficient resistance values for serving as resistors. However, it is extremely difficult to form resistors having small sectional areas by the aforementioned screen printing.

SUMMARY OF THE INVENTION

In order to solve the various problems of the conventional methods of manufacturing resistors integrated in sintered bodies, an object of the present invention is to provide a method of manufacturing a resistor integrated in a sintered body, which can readily form various patterns of resistors integrated in sintered bodies having desired resistance values at a low cost in high accuracy with no requirement for strict atmospheric control.

According to a wide aspect of the present invention, provided is a method of manufacturing a resistor integrated in a sintered body, comprising the steps of preparing a metal thin film transfer material having a carrier substrate and a metal thin film which is formed on the carrier substrate to be in a prescribed pattern, obtaining a laminate of the metal thin film obtained from the metal thin film transfer material and ceramic green sheets, and firing the laminate for obtaining a sintered body and forming a resistor consisting of the metal thin film in the Sintered body.

According to another aspect of the present invention, there is provided a method of a resistor integrated in a sintered body, comprising the steps of preparing a metal thin film transfer material having a carrier substrate and a metal thin film which is formed on the carrier substrate to be in a prescribed pattern, obtaining a laminate of the metal thin film obtained from metal this film material, ceramic green sheets and conductive pattern, and firing the laminate for obtaining a sintered body and forming a circuit containing at least one resistor consisting of the metal thin film in the sintered body. In this case, the conductive pattern is prepared by forming the conductor pattern on the ceramic green sheet formed on the ceramic green sheet by painting a conductive material or transferring the pattern from another carrier substrate.

According to the present invention, the metal, thin film which is formed in a prescribed pattern is prepared in the form of a metal thin film transfer material, and stacked with the ceramic green sheet. The metal thin film may be patterned after forming a metal thin film on an entire surface of the one surface of the substrate. Alternatively, the metal thin film may be directly formed in a prescribed pattern on the substrate by using a mask or the like, for example. Thus, metal thin films of various patterns can be so readily formed that it is possible to readily form circuits of various patterns.

Further, the resistor integrated in a sintered body is formed by the aforementioned metal thin film, whereby no strict atmospheric control is required in later treatment such as firing of ceramics and alloying of the metal thin film. Namely, the ceramics can be fired also in a reducing atmosphere, whereby a multilayer ceramic electronic component containing the resistor integrated in a sintered body can be readily manufactured and a conductor film integrated therein can be formed with no employment of a high-priced noble metal, so that the cost for the multilayer ceramic electronic component can be reduced.

The aforementioned laminate of the metal thin film and the ceramic green sheet can be prepared by transferring the metal thin film from the metal thin film transfer material to one major surface of the ceramic green sheet for obtaining a green sheet integrated with the metal thin film and stacking at least one another ceramic green sheet and/or another green sheet integrated with a metal thin film on the green sheet integrated with the metal thin film, or by applying a slurry onto the metal thin film transfer material provided with the metal thin film for obtaining a green sheet integrated with the metal thin film and stacking this green sheet integrated with the metal thin film on another ceramic green sheet and/or another green sheet integrated with a metal thin film by transfer.

According to a specific aspect of the present invention, the step of preparing the metal thin film transfer material comprises the steps of forming the metal thin film on the carrier substrate by a thin film forming method, and patterning the metal thin film by photolithography. When the metal thin film is thus patterned by photolithography, it is possible to readily and accurately form a resistive element having a desired resistance value due to high pattern accuracy.

As to the step of transferring the metal thin film from the metal thin film transfer material to the ceramic green sheet, a plurality of metal thin film transfer materials may be prepared to transfer a plurality of metal thin films to one major surface of the ceramic green sheet. The metal thin films which are provided on the plurality of metal thin film transfer materials may have different patterns. When a plurality of metal thin film transfer materials are thus prepared, it is possible to readily form various circuits by transferring a plurality of metal thin films and a plurality of types of metal thin film patterns onto the ceramic green sheet.

Preferably, a plurality of metal thin films are stacked/formed on the carrier substrate by a thin film forming method. In this case, the plurality of metal thin films are alloyed in the step of firing the laminate, to form a resistor. The resistor which is formed by alloying a plurality of metal thin films is prepared from that of a proper composition which can implement a sufficient resistance value for serving as a resistive element, such as an Ag-Pd alloy, an Ni-Cu alloy or the like, for example. In order to implement a resistor consisting of an alloy of such a composition, the plurality of metal thin films are made of proper metal materials such as Ag, Pd, Ni and/or Cu, in response to the alloy composition. Thus, it is possible to form a resistor having a sufficient resistance value for serving as a resistive element by forming a plurality of metal thin films consisting of different materials on a carrier substrate and alloying the plurality of metal thin films in firing of the laminate.

According to still another aspect of the present invention, not only a resistor integrated in a sintered body but a multilayer ceramic electronic component is provided through the aforementioned steps of the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
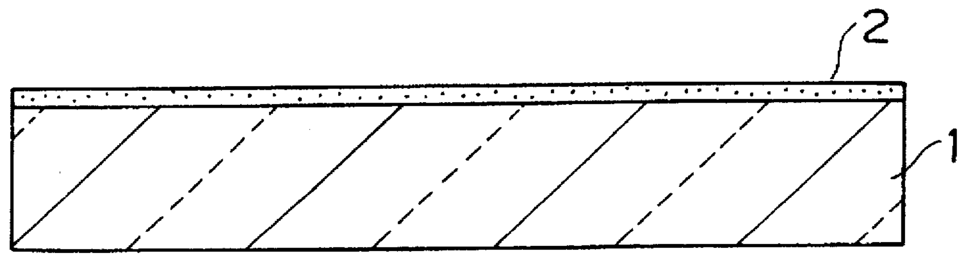
FIG. 1 is a sectional view showing a surface lubricant layer formed on a glass substrate in a first embodiment of the present invention.
Figure 2:
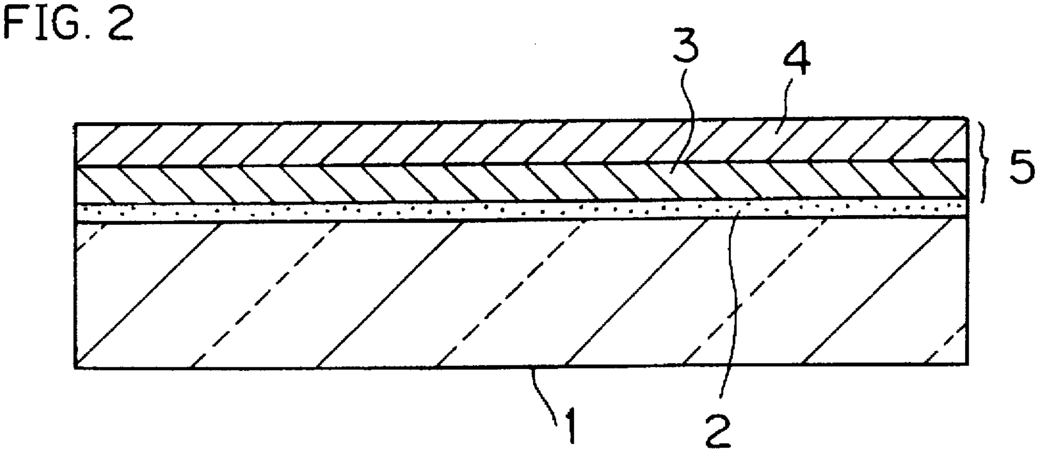
FIG. 2 is a sectional view showing a metal film deposited on the glass substrate for forming conductor films in the first embodiment.

First, a glass substrate 1 provided with a surface lubricant layer 2 on its one major surface was prepared as shown in FIG. 1. The surface lubricant layer 2 is formed by coating an upper surface of the glass substrate 1 with fluororesin, for example. The surface lubricant layer 2 is adapted to facilitate separation of metal thin films from the glass substrate 1 in a later transfer step. Therefore, the material and the thickness of the surface lubricant layer 2 are not particularly restricted.

Similarly, a carrier substrate is not restricted to the aforementioned glass substrate 1, but may alternatively formed by a proper synthetic resin film or the like.

Then, Ag was deposited on the overall major surface of the glass substrate 1 which was provided with the surface lubricant layer 2, to form an Ag film 3 of 0.3 μm in thickness. Further, a Pd film 4 of 0.5 μm in thickness was formed on the Ag film 3 also by deposition. A deposition film 5 of a two-layer structure was defined by the Ag film and the Pd film 4 and thereafter patterned by photolithography, to form metal thin films 5A and 5B (see FIG. 3). The metal thin films 5A and 5B extend perpendicularly to the plane of FIG. 3, with widths of 500 μm.

Figure 3:
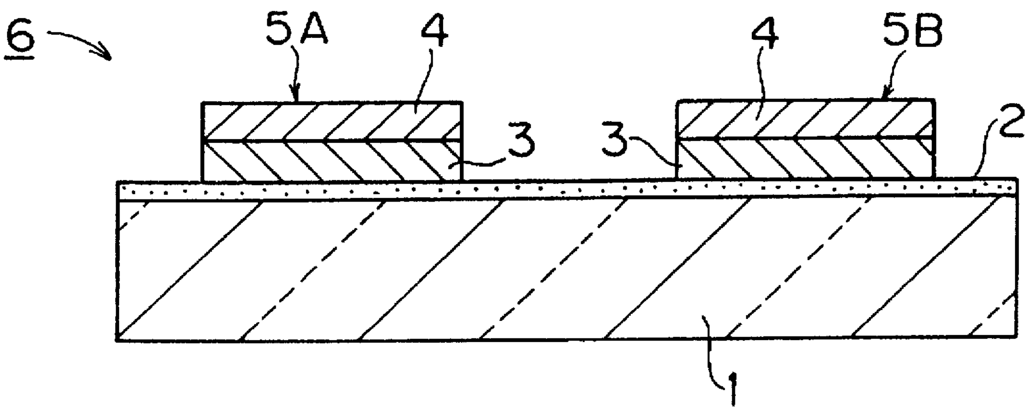
FIG. 3 is a sectional view showing a patterned state of the metal thin film according to the first embodiment shown in FIG. 2.

The structure shown in FIG. 3, i.e., a metal thin film transfer material 6, is adapted to transfer the metal thin films 5A and 5B for forming conductor films on a ceramic multilayer substrate as described later.

Figure 4:
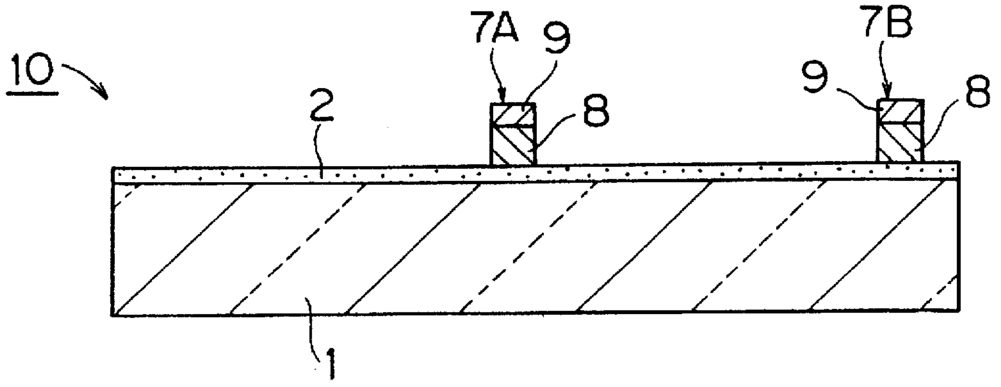
FIG. 4 is a sectional view showing a metal thin film for forming resistors patterned on a glass substrate in the first embodiment.

Then, Ag and Pd films having thicknesses of 0.3 μm and 0.2 μm respectively were successively formed on another glass substrate 1 provided with a surface lubricant layer 2 on its surface, similarly to the above. Thereafter these films were patterned by photolithography, to form metal thin films 7A and 7B shown in FIG. 4. Referring to FIG. 4, numerals 8 and 9 denote the Ag and Pd films respectively. The metal thin films 7A and 7B formed by patterning correspond to portions forming resistors in the ceramic multilayer substrate described later, and linearly extend perpendicularly to the plane of FIG. 4 with widths of 20 μm, which are extremely narrower than those of the metal thin films 5A and 5B shown in FIG. 3.

Figure 5:
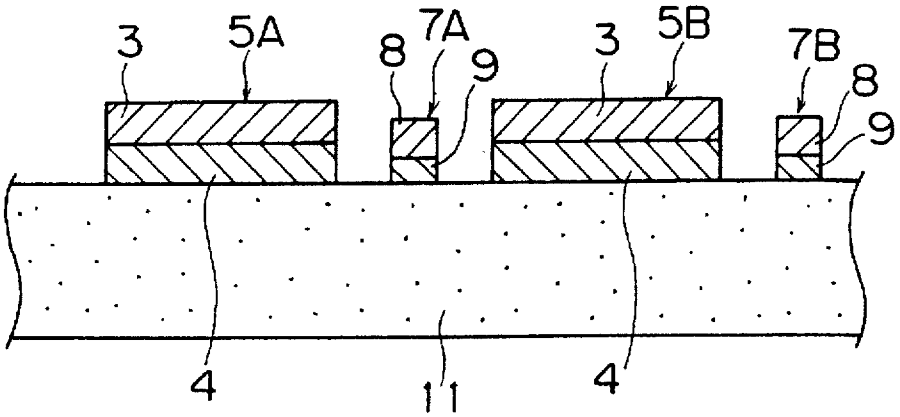
FIG. 5 is a sectional view showing the metal thin films transferred onto an alumina green sheet.

Then, an alumina green sheet 11 of 200 μm in thickness was prepared so that the metal thin films 5A, 5B, 7A and 7B were transferred onto this alumina green sheet 11, as shown in FIG. 5. Namely, the metal thin film transfer material 6 shown in FIG. 3 was stacked on an upper surface of the alumina green sheet 11 in a vertically inverted state so that the metal thin films 5A and 5B were brought into pressure contact with the upper surface of the alumina green sheet 1, and then the glass substrate 1 was separated from the alumina green sheet 11 with the surface lubricant layer 2, to transfer the metal thin films 5A and 5B. Then, a metal thin film transfer material 10 shown in FIG. 4 was employed to transfer the metal thin films 7A and 7B onto the upper surface of the alumina green sheet 11, similarly to the above.

Thus, a prescribed circuit was formed on the upper surface of the alumina green sheet 11.

Figure 6:
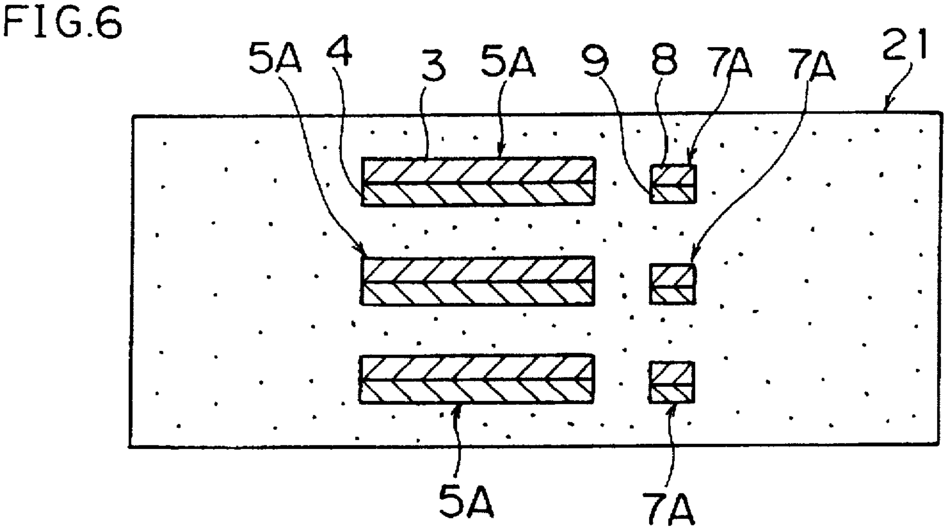
FIG. 6 is a sectional view showing a ceramic laminate obtained in the first embodiment.

Then, a plurality of alumina green sheets of 200 μm in thickness having metal thin films 5A, 5B, 7A and 7B transferred thereto were stacked on the upper surface of the alumina green sheet 11 shown in FIG. 5, blank alumina green sheets were further stacked on upper and lower portions of these alumina green sheets, and pressurized along the thickness direction to obtain a mother laminate, which in turn was cut along the thickness direction, to obtain a laminate 21 shown in FIG. 6.

In the laminate 21 shown in FIG. 6, three layers of circuits provided with metal thin films 5A and 7A in parallel with each other are formed in intermediate vertical positions. Then, the laminate 21 was fired to alloy the metal thin films 5A and 7A. Further, electrodes for external connection were formed, thereby preparing a ceramic multilayer substrate 22 according to a first embodiment of the present invention.

Figure 7:
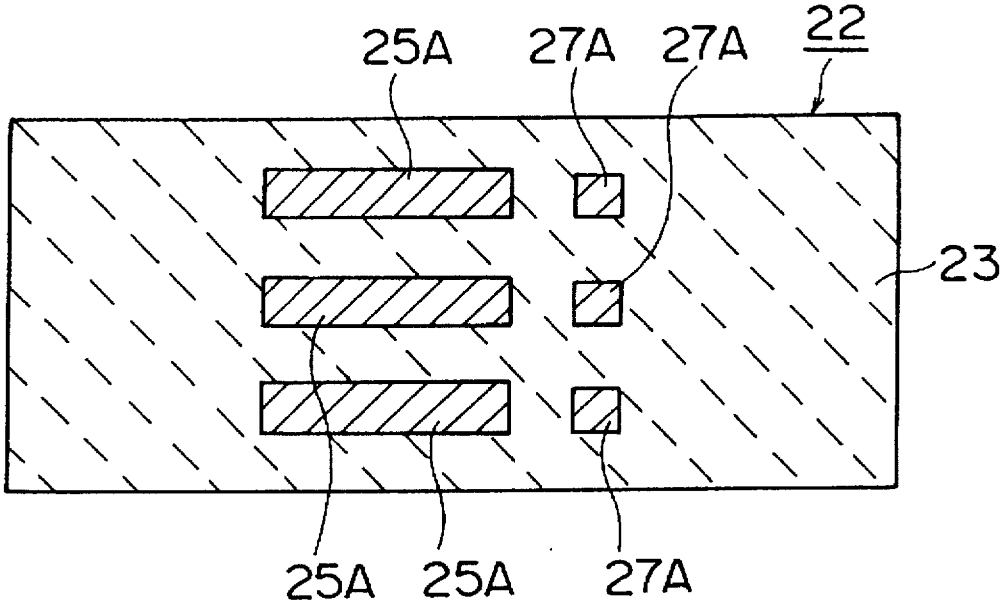
FIG. 7 is a sectional view of a ceramic multilayer substrate obtained in the first embodiment.

FIG. 7 shows a section of the ceramic multilayer substrate 22. This ceramic multilayer substrate 22 comprises a ceramic sintered body 23, which is provided therein with conductor films 25A formed by alloying of the metal thin films 5A, and resistors 27A formed by heat treatment and alloying of the metal thin films 7A.

A ceramic multilayer substrate according to a second embodiment of the present invention was prepared similarly to the first embodiment, except that widths of metal thin films 7A for forming resistors were increased from 20 μm to 30 μm. Further, a ceramic multilayer substrate according to a third embodiment of the present invention was prepared similarly to the first embodiment, except that widths of metal thin films 7A were increased from 20 μm to 40 μm.

Electric resistance values of the resistors provided in the ceramic multilayer substrates according to the first to third embodiments obtained in the aforementioned manners were measured. Table 1 shows the results with designed resistance values.

TABLE 1

| | First Embodiment | Second Embodiment | Third Embodiment |
|---|---|---|---|
| Designed Value (Ω) | 600 | 400 | 300 |
| Measured Value (Ω) | 601 | 401 | 305 |

In every one of the first to third embodiments, dispersion of the resistance values with respect to the designed values was 5% at 3 Vc. For the purpose of comparison, a corresponding ceramic multilayer substrate was prepared by a conventional method including a step of screen-printing resistive paste on a ceramic green sheet. In this multilayer substrate, dispersion of resistance values with respect to designed values was 25% at 3 Cv.

Thus, it is understood possible to form resistors having small dispersion with respect to designed values through a step of integrating metal thin films which are patterned by transfer with a ceramic green sheet, similarly to the first to third embodiments.

Further, it is clearly understood from the aforementioned embodiments that patterns of metal thin films which are transferred to a ceramic green sheet can be readily modified by photolithography according to the inventive method of manufacturing a resistor integrated in a sintered body, whereby resistors of various patterns can be readily formed.

While the metal thin films 5A, 5B, 7A and 7B were transferred onto the alumina green sheet 11 to obtain a green sheet integrated with metal thin films in each of the aforementioned embodiments, such a green sheet integrated with metal thin films may alternatively be formed by applying a slurry onto a carrier substrate provided with metal thin films.

In this case, the green sheet integrated with metal thin films is stacked on another ceramic green sheet and/or another green sheet integrated with metal thin films, to obtain a laminate. The carrier substrate is separated after the stacking.

While the metal thin films 7A and 7B were transferred onto the alumina green sheet 11 and heat treated in firing of ceramics for forming resistors, metal thin films which are transferred onto a ceramic green sheet for forming resistors may be of a plurality of patterns. When a plurality of metal thin films for forming resistors are transferred, further, the metal thin films may have different shapes.

While the metal thin films were formed by deposition in each of the aforementioned embodiments, the same may alternatively be formed by another thin film forming method such as sputtering or plating, or a combination thereof. Further, the metal thin films may be formed by multilayer films in which some metals are combined with each other, or by pure metal single layers.

In addition to a ceramic multilayer substrate, the present invention is applicable to various multilayer ceramic electronic components such as a CR composite type multilayer ceramic electronic component, containing resistors in ceramic sintered bodies.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a resistor integrated in a sintered body, comprising the steps of:

preparing a metal thin film transfer material having a carrier substrate and a plurality of metal thin films formed on said carrier substrate to be in a prescribed pattern;

obtaining a laminate of said metal thin films obtained from said metal thin film transfer material and ceramic green sheets; and firing said laminate for obtaining a sintered body and forming a resistor consisting of said metal thin films in said sintered body, wherein said plurality of metal thin films are alloyed during the firing of said laminate, for forming said resistor.

2. The method of manufacturing a resistor integrated in a sintered body in accordance with claim 1, wherein said step of obtaining said laminate comprises the steps of:

transferring said metal thin films from said carrier substrate to one major surface of one of said ceramic green sheets for obtaining a green sheet integrated with said metal thin films, and stacking at least one of another ceramic green sheet and another green sheet integrated with a metal thin film on said green sheet integrated with said metal thin films for obtaining said laminate.

3. The method of manufacturing a resistor integrated in a sintered body in accordance with claim 2, wherein a plurality of said metal thin film transfer materials are prepared for transferring a plurality of said metal thin films from said plurality of metal thin film transfer materials to said one major surface of said ceramic green sheet.

4. The method of manufacturing a resistor integrated in a sintered body in accordance with claim 3, wherein said metal thin films being provided on said plurality of metal thin film transfer materials have different patterns.

5. The method of manufacturing a resistor integrated in a sintered body in accordance with claim 1, wherein said step of obtaining said laminate comprises the steps of:

applying a slurry onto said metal thin film transfer material being provided with said metal thin films for obtaining a green sheet integrated with said metal thin films, and stacking said green sheet integrated with said metal thin films on at least one of another ceramic green sheet and another green sheet integrated with a metal thin film for obtaining a laminate.

6. The method of manufacturing a resistor integrated in a sintered body in accordance with claim 1, wherein said step of preparing said metal thin film transfer material comprises the steps of:

forming said metal thin films on said carrier substrate by a thin film forming method, and patterning said metal thin films by photolithography.

7. A method of manufacturing a multilayer ceramic electronic component, comprising the steps of the method of manufacturing a resistor integrated in a sintered body in accordance with claim 1.

8. A method of manufacturing a resistor integrated in a sintered body, comprising the steps of:

preparing a metal thin film transfer material having a carrier substrate and a plurality of metal thin films formed on said carrier substrate to be in a prescribed pattern;

obtaining a laminate of said metal thin films obtained from said metal thin film transfer material, ceramic green sheets and a conductive pattern; and firing said laminate for obtaining a sintered body and forming a circuit containing a resistor consisting of said metal thin films and the conductive pattern in said sintered body wherein said plurality of metal thin films are alloyed during firing of said laminate, for forming said resistor.

9. The method of manufacturing a resistor integrated in a sintered body in accordance with claim 8, wherein said conductive pattern is prepared by forming the conductive pattern on one of said ceramic green sheets.

10. The method of manufacturing a resistor integrated in a sintered body in accordance with claim 9, wherein said conductive pattern is formed on the one of said ceramic green sheets by transferring it from another carrier substrate.

11. The method of manufacturing a resistor integrated in a sintered body in accordance with claim 8, wherein said step of obtaining said laminate comprises the steps of:

transferring said metal thin films from said carrier substrate to one major surface of one of said ceramic green sheets for obtaining a green sheet integrated with said metal thin films, and stacking at least one of another ceramic green sheet and another green sheet integrated with a metal thin film on said green sheet integrated with said metal thin films for obtaining said laminate.

12. The method of manufacturing a resistor integrated in a sintered body in accordance with claim 8, wherein said step of obtaining said laminate comprises the steps of:

applying a slurry onto said metal thin film transfer material being provided with said metal thin films for obtaining a green sheet integrated with said metal thin films, and stacking said green sheet integrated with said metal thin films on at least one of another ceramic green sheet and another green sheet integrated with a metal thin film for obtaining a laminate.

13. The method of manufacturing a resistor integrated in a sintered body in accordance with claim 1, wherein said step of preparing said metal thin film transfer material comprises the steps of:

forming said metal thin films on said carrier substrate by a thin film forming method, and patterning said metal thin films by photolithography.

14. The method of manufacturing a resistor integrated in a sintered body in accordance with claim 13, wherein a plurality of said metal thin transfer materials are prepared for transferring a plurality of said metal thin films from said plurality of metal thin film transfer materials to said one major surface of one of said ceramic green sheets.

15. The method of manufacturing a resistor integrated in a sintered body in accordance with claim 14, wherein said metal thin films being provided of said plurality of metal thin film transfer materials have different patterns.

16. A method of manufacturing a multilayer ceramic electronic component, comprising the steps of the method of manufacturing a resistor integrated in a sintered body in accordance with claim 8.

* * * * *